United States Patent [19]

Milliken

[11] Patent Number: 4,888,200
[45] Date of Patent: Dec. 19, 1989

[54] PROCESS AND MACHINE FOR ELECTROSTATIC COATING

[75] Inventor: Robert D. Milliken, Columbia, Md.

[73] Assignee: W. R. Grace & Co.,-Conn., New York, N.Y.

[21] Appl. No.: 184,463

[22] Filed: Apr. 21, 1988

[51] Int. Cl.$^4$ .......................... B05D 1/04; B05B 5/04
[52] U.S. Cl. ........................................ 427/31; 427/27; 427/33; 118/70; 118/630; 198/499
[58] Field of Search .................. 198/497, 499; 118/70, 118/324, 630, 326, 634; 427/27, 33, 31

[56] References Cited

U.S. PATENT DOCUMENTS 3,739,745  6/1973  Turpin .............................. 118/70 X

FOREIGN PATENT DOCUMENTS 52-126172  10/1977  Japan .
54-009919   1/1979  Japan .
58-223459  12/1983  Japan .
60-075354   4/1985  Japan .
2053121     2/1981  United Kingdom ................ 198/499

OTHER PUBLICATIONS

"Production: An Editor's Eye View"-Circuits Manufacturing Feb., 1986, p. 80.

Primary Examiner—Evan Lawrence
Attorney, Agent, or Firm—Charles A. Cross; W. W. McDowell, Jr.

[57] ABSTRACT

A process and apparatus for an electrostatic spray coating operation wherein liquid overspray in the spray coating operation is collected and drained onto a workpiece support. The overspray is then removed from the workpiece support by a squeegee blade wherein the collected overspray is drained into a sump. From the sump, the spray, and optionally with makeup liquid, is recycled to the spray head.

8 Claims, 2 Drawing Sheets

PROCESS AND MACHINE FOR ELECTROSTATIC COATING

This invention relates to an improvement in electrostatic spray-coating of flat workpieces such as printed circuit boards, resulting, overall, in a more economical system.

BACKGROUND OF THE INVENTION

In making circuit boards and the like, it is frequently routine to apply a uniform coating over the workpiece, for example, by roller coating, curtain coating, screen printing, and the like. A preferred system for this involves electrostatic spraying, which permits application of a uniform coating under automated assembly line conditions. So far as I am aware, electrostatic spray techniques have not been used to apply uniform coatings of 100% solids (i.e., liquid but solventless) curable solder masks, plating resists, etch resists, and the like. In a production operation the workpiece to be electrostatically spray coated is placed automatically on an endless belt, which may take it through one or more preliminary operations (cleaning, bottom-coating to enhance conductivity, etc.) before it enters the spray chamber. A current assembly line operation is shown, e.g., in *Circuits Manufacturing*, February 1986, pp. 80 and 81, for electrostatically spray-coating both sides of circuit boards; the operation includes UV printing and development in dilute sodium carbonate solution.

In all currently known board spray systems, overspray inevitably collects on the moving belt, between the boards, along the belt sides, and even off the belt in areas paralleling the belt. This overspray is difficult to deal with. It drips from the chamber walls and from the belt. Some sticks to the belt, where it tends to build up in uneven layers. This results in random loss of conductivity (from the workpiece to the ground), which in turn results in non-uniform coatings, transfer of spray material to the underside of the panels, and other problems. One of the best means of coping with overspray in the past has involved placing paper under the workpieces. The paper catches the overspray, and the spattered paper is retrieved and discarded. This solution has obvious drawbacks. Means have to be provided for feeding the paper properly to the system and recovering disposing of it. Spray loss, paper costs, and labor costs add to the expense.

SUMMARY OF THE INVENTION

Accordingly, it is an object of the invention to efficiently and easily remove electrostatic overspray from electrically conductive support belts. It is also an object to provide a means for collecting the overspray for recycling. The disclosed apparatus and process achieve these objectives by placing parallel to the spray zone a means for collecting oversray and for draining the overspray onto the conductive belt, wherein the collecting and draining means incline towards the belt. In conjunction with the collection and draining means, a squeegee blade is positioned against the belt as the belt is moving along its return path underneath the spray zone. The blade removes the overspray which has collected on the belt. These and other purposes will be apparent to one of ordinary skill from the following description.

DETAILED DESCRIPTION

Figure 2:
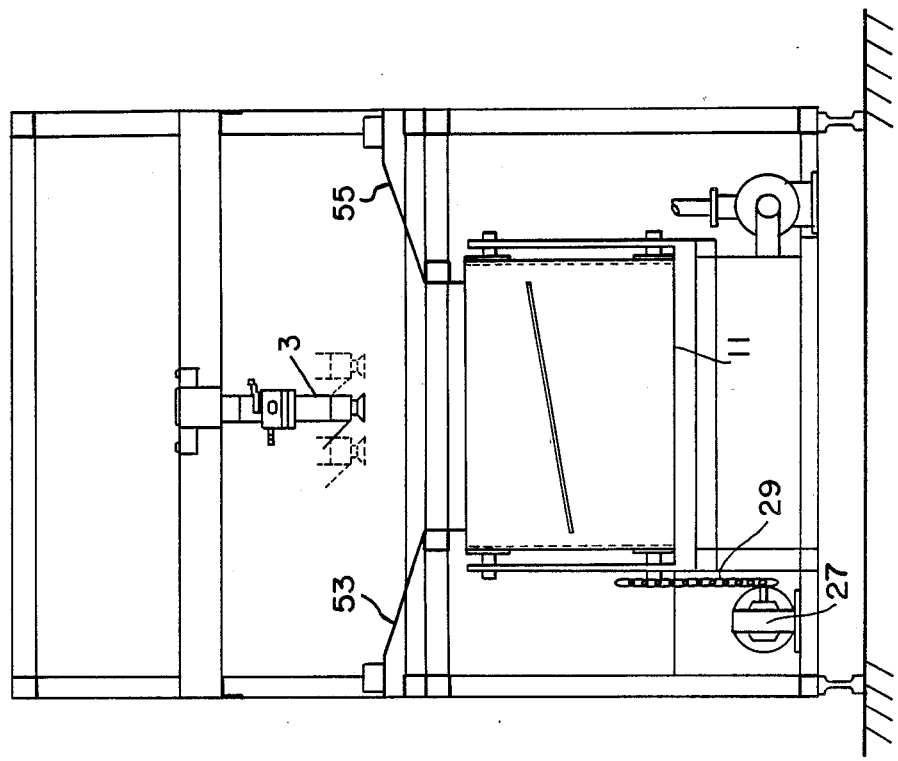
FIG. 2 a side elevation of an electrostatic spray coating chamber incorporating my invention.
Figure 1:
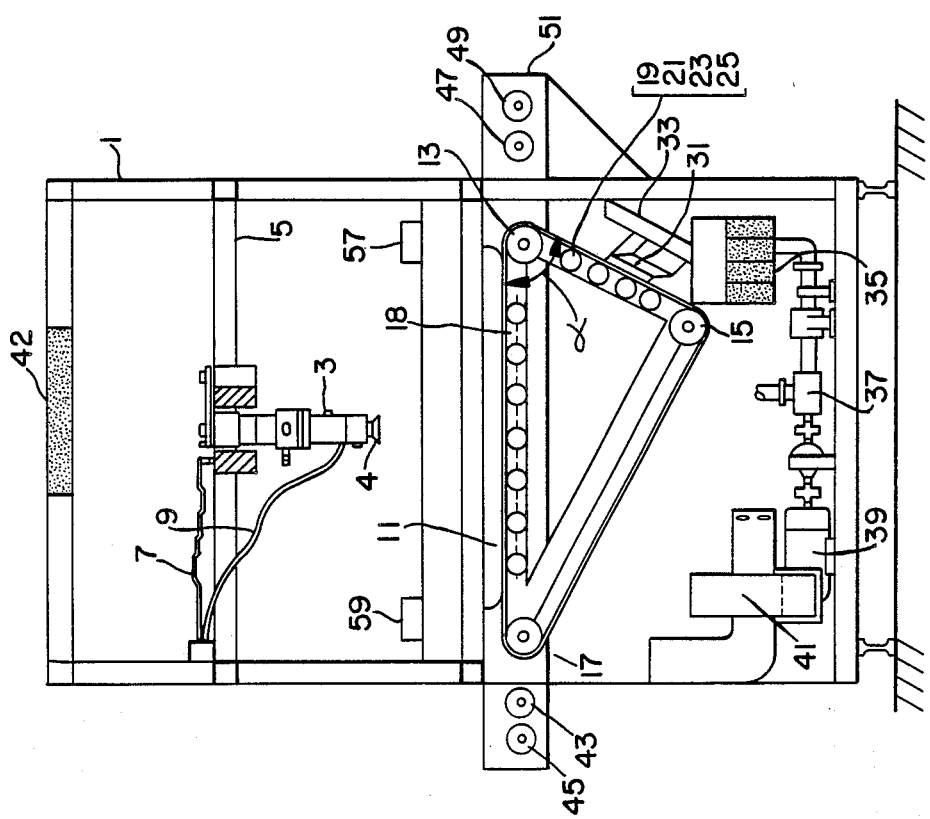
FIG. 1 shows a front elevation.

In FIG. 1, a frame 1 supports the various elements of the invention and its ancillaries. Frame 1 is actually entirely enclosed with metal walls except for entrance and exit slots for the workpieces and a front access opening. The enclosing walls are however not shown in the FIGURES. An electrostatic spray head air motor is shown at 3, and is carried on dielectric spray head support 5. As shown best in FIG. 2, spray head 3 is adjustable along support 5 so as to permit reciprocating movement. Conduit 7 supplies compressed air to oscillate the high speed rotating spray head 4. Conduit 9 is the polymer delivery tube to spray head 3. There are several other leads to the spray head, i.e., for air bearings, air motor, air shaping, and polymer shut-off. These are conventional and are not shown. Spray head 4 is also equipped with conventional electrode (not shown) to provide electrostatic charge to the atomized feed droplets. This electrostatic charge depends on the particular requirements of the spray unit. A potential in the range of 40-120 kilo volts is conventional.

A one-piece conductive belt is shown at 11 (shown best in FIG. 1). The belt is electrically grounded to zero potential. It is wide enough to accommodate the work pieces on it and is long enough to be returned at an angle alpha ($\alpha$) (preferably 90° or less) under the spray zone belt area. The belt is carried on rollers 13, 15 (a driving roller), and 17, which are in turn carried in subframe 18, affixed to frame 1. The belt is preferably but not necessarily metal, e.g., mild carbon or stainless steel.

Rolls 19, 21, 23, and 25 provide a base for belt 11, stabilizing it against pressure from the squeegee blade 31. Motor 27 drives the belt 11 via drive chain 29. Blade 31 is carried by adjustable blade support 33 (see FIG. 3). Collection sump 35 collects liquid from blade 33; recycle assembly 37 conveys liquid in sump 35 to spray head 3. Motor 39 drives the recycle assembly 37. A fan 41, also driven by motor 39, provides ventilation by drawing air through the high efficiency particle air (HEPA) filter 42 and exhausting it from the vents 57 and 59 of the upper spray chamber. Clean air is of course required in this type of operation. Associated with the invention are work piece conveyor rollers 43 and 45, and the spray chamber entrance; and exit conveyor rollers 47 and 49 at the exit. These rollers are supported in subframe 51. Overspray plates 53 and 55 catch side overspray and drain onto belt 11.

Figure 3:
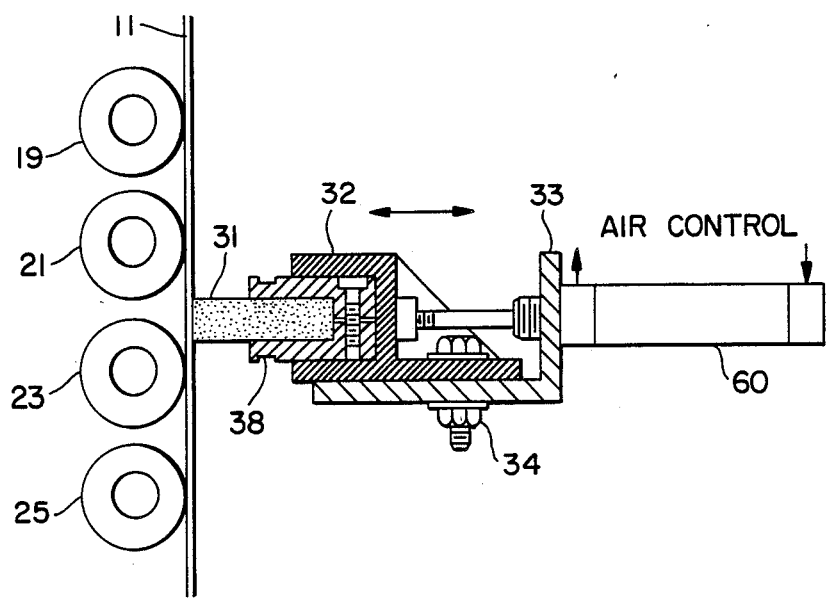
FIG. 3 is a view in section of the squeegee blade assembly of FIG. 1.

Referring now to FIG. 3, squeegee blade 31 is carried by C-bracket 32, which is attached to support 33 by nut and bolt assembly 34, which is adjustable in a slot (not shown). The blade 31 is clamped between two holding bars 36 and 38 (suitably aluminum), bolted to bracket 32. Blade 31 was hard polyurethane, $\frac{1}{2}$ inch wide (thick) by 2 inches deep. Air cylinder 60 controls the position of the blade 31, moving it toward or away from the belt 11.

The following example illustrates without limiting the invention.

EXAMPLE 1

Printed circuit boards were bottom coated with a surfactant to enhance conductivity. (This is not necessary on all boards.) Following this preliminary operation, the boards ("PCB's") were fed to belt 11, which was moving in the work direction at about 1.0–1.2 linear meters/min. The coating liquid in the spray head 4 was a commercially available solder mask, viscosity about 3,000 cps. It was sprayed at about 60 cc/min through the electrostatic spray head 4. The charge on the spray head 4 was 90,000 volts. The spray head 4 was rotating at about 34,000 rpm, and it was programmed to move automatically from side to side along support 5 at about one complete stroke per second. The film deposited on the PCB's was about 0.08–0.15 mm thick. Considerable overspray was deposited, around the panels, on the edges of the belt and on the overspray plates 53 and 55; from the latter plates it drained down onto the belt 11 (mild carbon steel, 0.19 mm thick). The belt 11 discharged the PCB's onto rolls 47 and 49 and into the next work station (here, exposure, not shown). (COMMENT: because there is no solvent to be evaporated, the PCB can go directly to exposure [imaging] unlike the sequence with solvent-containing coatings, which require a preliminary evaporation step.) The belt 11 with adherent overspray rotated down around rolls 13 and 15, where the overspray was squeegeed away by blade 31 and allowed to drain into sump 35. Blade 31 preferably contacts belt 11 at an angle, shown in FIG. 2, to facilitate drainage. Overspray liquid collected in sump 35 is pumped via recycle system 37 back to spray head 3, along with makeup coating liquid. Makeup is conveniently added to sump 35.

My invention works particularly well with non-solvent liquid resist, for etching, plating, soldering, and the like.

I claim:

1. In an electrostatic spray apparatus comprising
   (a) a supporting frame;
   (b) an electrostatic spray head affixed within said frame;
   (c) means to deliver liquid to said spray head;
   (d) a movable endless belt positioned under said spray head in a workpiece spray zone; and
   (e) means to rotate and return said belt to said spray zone; the improvement wherein
   (f) the endless belt is a one piece conductive belt;
   (g) the belt return path forms an angle ($\alpha$), 90° or less, with the path of the belt in the workpiece spray zone;
   (h) a squeegee blade is positioned against the belt below the belt return angle for removal of liquid overspray;
   (i) a liquid collection means is associated with and under the blade;
   (j) a means is provided to recycle liquid from liquid collection means (i) to spray head (b); and
   (k) a means is provided for collecting overspray and for draining said overspray onto said belt in said spray zone wherein said means inclines toward the belt (d) and is parallel to the sides of the work piece spray zone.

2. Apparatus according to claim 1 wherein the blade of (h) is affixed at an angle to the belt so as to drain liquid into the collection means (i).

3. Apparatus according to claim 1 wherein the belt is one piece mild carbon or stainless steel.

4. A process for electrostatic spraying a workpiece comprising
   (a) positioning said workpiece on a flat moving endless conductive one piece support, said support being under an electrostatic liquid spray source wherein said moving support is bordered by means for collecting overspray from said spray source and for draining said overspray onto said support; and
   (b) blading liquid overspray from the said support and collecting said liquid overspray.

5. Process according to claim 4 wherein the collected liquid is recycled to the spray source.

6. Process according to claim 4 wherein makeup liquid is added to the collected liquid.

7. Process according to claim 4 wherein the liquid coating material is a non-solvent liquid resist for etching, plating, or soldering.

8. A process according to claim 4 wherein said support comprises mild carbon or stainless steel.

* * * * *